(12) United States Patent
Boernert et al.

(10) Patent No.: US 11,867,784 B2
(45) Date of Patent: Jan. 9, 2024

(54) SPIRAL MR IMAGING WITH OFF-RESONANCE ARTEFACT CORRECTION

(71) Applicant: KONINKLIJKE PHILIPS N.V., Eindhoven (NL)

(72) Inventors: Peter Boernert, Hamburg (DE); Karsten Sommer, Hamburg (DE); Christophe Michael Jean Schulke, Hamburg (DE); Johan Samuel Van Den Brink, Meteren (NL)

(73) Assignee: Koninklijke Philips N.V., Eindhoven (NL)

( * ) Notice: Subject to any disclaimer, the term of this patent is extended or adjusted under 35 U.S.C. 154(b) by 65 days.

(21) Appl. No.: 17/614,595

(22) PCT Filed: Jun. 3, 2020

(86) PCT No.: PCT/EP2020/065273
§ 371 (c)(1),
(2) Date: Nov. 29, 2021

(87) PCT Pub. No.: WO2020/245144
PCT Pub. Date: Dec. 10, 2020

(65) Prior Publication Data
US 2022/0229134 A1    Jul. 21, 2022

(30) Foreign Application Priority Data
Jun. 4, 2019  (EP) .................................... 19178061

(51) Int. Cl.
*G01R 33/48* (2006.01)
*G01R 33/561* (2006.01)
*G01R 33/565* (2006.01)

(52) U.S. Cl.
CPC ...... *G01R 33/4824* (2013.01); *G01R 33/5611* (2013.01); *G01R 33/56563* (2013.01)

(58) Field of Classification Search
CPC ............ G01R 33/4824; G01R 33/5608; G01R 33/5611; G01R 33/56563;
(Continued)

(56) References Cited

U.S. PATENT DOCUMENTS

| 7,642,777 B1 | 1/2010 | Meyer et al. |
| 8,238,634 B1 | 8/2012 | Meyer et al. |

(Continued)

OTHER PUBLICATIONS

Kuestner et al "Simultaneous Detection and Identification of MR Artefact Types in Whole Body Imaging" ISMRMS 2018.
(Continued)

*Primary Examiner* — Rishi R Patel

(57) ABSTRACT

The invention relates to a method of MR imaging of an object (10) positioned in an examination volume of a MR device (1). It is an object of the invention to enable efficient and high-quality non-Cartesian MR imaging, even in situations of strong $B_0$ inhomogeneity. In accordance with the invention, the method comprises: —subjecting the object to an imaging sequence comprising at least one RF excitation pulse and modulated magnetic field gradients, —acquiring MR signals along at least one non-Cartesian k-space trajectory, —reconstructing an MR image from the acquired MR signals, and —detecting one or more mal-sampling artefacts caused by $B_0$ inhomogeneity induced insufficient k-space sampling in the MR image using a deep learning network. Moreover, the invention relates to a MR device (1) and to a computer program.

13 Claims, 3 Drawing Sheets

(58) Field of Classification Search
CPC .......... G01R 33/56536; G01R 33/4826; G06T 5/006; G06T 11/008; G06T 2207/20081; G06T 2207/20084; G06N 3/045; G06N 3/08

See application file for complete search history.

(56) References Cited

U.S. PATENT DOCUMENTS

| | | |
|---|---|---|
| 2005/0017717 A1 | 1/2005 | Duerk et al. |
| 2014/0152304 A1 | 6/2014 | Fielden et al. |
| 2016/0202335 A1 | 7/2016 | Fielden et al. |
| 2019/0277935 A1* | 9/2019 | Zeng ..................... G06N 3/045 |
| 2020/0126190 A1* | 4/2020 | Lebel ............... G06V 30/19173 |

OTHER PUBLICATIONS

Ahunbay et al "Rapid Method for De-Blurrring Spiral MR Images" Magnetic Resonance Med. 2000, vol. 44 p. 491-494.

Sutton et al "Fast Iterative Image Reconstruction for MRI in the Presence of Field Inhomogeneities" IEEE Trans. Med. Imaging, 2003 p. 178-188.

Nayak et al "Efficient Off-Resonance Correction for Spiral Imaging" Magn. Reson. Med 2001, vol. 45, p. 521-524.

Brosch et al "Foveal Fully Convolutional Nets for Mutli-Organ Segmentation" Proceedings of SPIE vol. 10574 2018.

Ronneberger et al "U-Net Convolutional Networks for Biomedical Image Segmentation" International Conf. on Medical Image Computation and Computer Assisted Intervention pp. 234-241.

Mohammed et al "Y-Net a Deep Convolutional Neural Network for Polyp Detection" Computer Vision and Pattern Recognition 2018.

Yudilevich et al "Spiral Sampling in Magnetic Resonance Imaging the Effect of Inhomogeneities" IEEE Transactions on Medical Imaging vol. 6, No. Dec. 4, 1987 p. 337-345.

Zeng et al "Deep Residual Network for Off-Resonance Artifact Correction With Application To Pediatric Body MRA With 3D Cones" Magnetic Reson. in Med. vol. 82, No. May 4, 22, 2019 p. 1398-1411.

Sinha et al "A Neural Network Approach for Non-Caresian K-Space Parallel Imaging Reconstruction" Proceedins of the Int. Soc. for Magnetic Reson in Med. May 19, 2007 p. 336.

Man et al "Multifrequency Interpolation for Fast Off-Resonance Correction" MRM 37 p. 765-792 (1997).

Man LC, Pauly JM, Macovski A. "Improved automatic off-resonance correction without a field map in spiral imaging" Magn Reson Med. Jun. 1997;37(6):906-13.

International Search Report and Written Opinion from PCT/EP2020/065273 dated Dec. 10, 2020.

* cited by examiner b)

a)

SPIRAL MR IMAGING WITH OFF-RESONANCE ARTEFACT CORRECTION

CROSS REFERENCE TO RELATED APPLICATIONS

This application is a U.S. national phase application of International Application No. PCT/EP2020/065273 filed on Jun. 3, 2020, which claims the benefit of EP Application Serial No. 19178061.8 filed on Jun. 4, 2019 and is incorporated herein by reference.

FIELD OF THE INVENTION

The invention relates to the field of magnetic resonance (MR) imaging. It concerns a method of MR imaging of an object. The invention also relates to a MR device and to a computer program to be run on a MR device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for imaging of soft tissue they are superior to other imaging methods in many respects, do not require ionizing radiation and are usually not invasive.

According to the MR method in general, the object, for example the body of the patient to be examined, is arranged in a strong, uniform magnetic field ($B_0$) whose direction at the same time defines an axis (normally the z-axis) of the co-ordinate system on which the measurement is based. The magnetic field produces different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse), so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse. In the case of a so-called 90° pulse, the spins are deflected from the z axis to the transverse plane (flip angle 90°).

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z direction relaxes with a second time constant $T_2$ (spin-spin or transverse relaxation time). The variation of the magnetization can be detected by means of receiving RF coils which are arranged and oriented within an examination volume of the MR device in such a manner that the variation of the magnetization is measured in the direction perpendicular to the z-axis. The decay of the transverse magnetization is accompanied, after application of, for example, a 90° pulse, by a transition of the nuclear spins (induced by local magnetic field inhomogeneities) from an ordered state with the same phase to a state in which all phase angles are uniformly distributed (dephasing). The dephasing can be compensated, e.g., by means of a refocusing pulse (for example a 180° pulse). This produces an echo signal (spin echo) in the receiving coils.

To realize spatial resolution in the body, constant magnetic field gradients extending along the three main axes are superposed on the uniform magnetic field, leading to a linear spatial dependency of the spin resonance frequency. The signal picked up in the receiving coils then contains components of different frequencies which can be associated with different locations in the body. The signal data obtained via the receiving coils corresponds to the spatial frequency domain called k-space. The k-space data usually includes multiple lines acquired with different phase encoding. Each line is digitized by collecting a number of samples. A set of k-space data is converted to a MR image by means of an image reconstruction algorithm.

Off-resonance effects occurring due to $B_0$ inhomogeneity and tissue-induced susceptibility variations represent a major source of artefacts that are very common in MR images. The ISMRM-2019 abstract '*Simultaneous detection and identification of MR artefact types in whole body imaging*' by Th. Kuestner et a.1 in ISMRM-2018 (abstract 430) mentions a CNN-based detection of aretfacts orignanting from motion or field inhomogeneities in magnetic resonance images acquired with $T_1$-weighted or $T_2$-weighted FSE sequences. With MR signal acquisition along Cartesian k-space trajectories, it is well-known that $B_0$ inhomogeneity gives rise to geometric distortions that in general do not greatly affect the image quality. However, with non-Cartesian k-space trajectories, like in spiral imaging, off-resonance usually manifests itself as a blurring of the ideal image which can severely affect the diagnostic validity of the image. The extent of $B_0$ inhomogeneity-caused artefacts scales with the main magnetic field strength.

Spiral imaging is a fast MR imaging technique that benefits from an efficient k-space coverage and a low sensitivity to flow artefacts. It is, however, particularly vulnerable to $B_0$ inhomogeneities when long acquisition intervals are used (as, e.g., in single-shot spiral imaging). Such long acquisition intervals in combination with parallel imaging techniques are essential to obtain the highest possible spatial resolution. This is of interest in functional MR imaging (fMRI) and also in diffusion weighted imaging (DWI) to mitigate problems of physiological and patient motion.

De-blurring methods for spiral MR imaging are known in the art. It is known, e.g., to acquire a $B_0$ map and to correct the MR signal data for $B_0$ inhomogeneity effects based on the $B_0$ map (see, e.g., Ahunbay et al., "Rapid method for de-blurring spiral MR images", Magn. Reson. Med. 2000, vol. 44, p. 491-494; Sutton et al., "Fast, iterative image reconstruction for MRI in the presence of field inhomogeneities", IEEE Trans. Med. Imaging. 2003, vol. 22, p. 178-188; Nayak et al., "Efficient off-resonance correction for spiral imaging", Magn. Reson. Med. 2001, vol. 45, p. 521-524).

However, even after application of a de-blurring method of the afore-mentioned type, artefacts often remain in image regions of very strong susceptibility-induced magnetic field gradients. Such artefacts appear in the reconstructed and de-blurred MR image as characteristic ringing artefacts in case of spiral k-space trajectories and can overlap or cover interesting anatomical details. The reason for such remaining artefacts is that, in case of strong (typically susceptibility-induced) local magnetic field gradients, the shape of the spiral k-space trajectory deviates to a correspondingly large extent from the theoretical spiral shape for the respective voxels. This is illustrated in the two-dimensional k-space diagrams of FIG. 4. FIG. 4a shows an "ideal" spiral k-space trajectory as it would be obtained by application of sinusoidally modulated magnetic field gradients in the $k_x$- and $k_y$-directions in the presence of a perfectly homogeneous main magnetic field $B_0$. In FIG. 4b, however, $B_0$ is inhomogeneous with a strong gradient in the x-direction such that the corresponding voxel position "sees" a skewed k-space trajectory which significantly deviates from the ideal spiral shape. The consequence of this effect is that k-space sampling is insufficient and violates the Nyquist criterion in some parts of k-space. Insufficient signal data is sampled from a significant portion of k-space in FIG. 4b. These effects can result in undesirable remaining artefacts caused by local gradient induced insufficient k-space sampling (referred to as mal-sampling artefacts in the following) at locations of strong local off-resonance which cannot easily be correct for.

SUMMARY OF THE INVENTION

From the foregoing it is readily appreciated that there is a need for an improved MR imaging technique. It is an object of the invention to address the above-mentioned limitations and to enable efficient and high-quality non-Cartesian MR imaging, even in situations of strong $B_0$ inhomogeneity/strong $B_0$ gradients.

In accordance with the invention, a method of MR imaging of an object positioned in an examination volume of a MR device is disclosed. The method comprises:—
- subjecting the object to an imaging sequence comprising at least one RF excitation pulse and modulated magnetic field gradients,
- acquiring MR signals along at least one non-Cartesian k-space trajectory,
- reconstructing an MR image from the acquired MR signals, and
- detecting one or more mal-sampling artefacts caused by $B_0$ inhomogeneity induced insufficient k-space sampling using a deep learning network.

It is the gist of the invention to identify the sources of remaining mal-sampling artefacts in the reconstructed non-Cartesian (in particular spiral) MR image automatically using a deep learning network. Once the mal-sampling artefacts are detected, they can be corrected for in a targeted manner by a suitable algorithm.

In a preferred embodiment, the reconstructed MR image is de-blurred based on a $B_0$ map prior to the step of detecting mal-sampling artefacts, e.g. integrated in the step of reconstructing the MR image. By combining conventional $B_0$ map-based de-blurring with deep learning to detect residual mal-sampling artefacts an MR image of particularly high quality can be obtained even in cases of strong susceptibility effects and steep local magnetic field gradients.

In a further preferred embodiment, the deep learning network is trained to derive an artefact map from the MR image, which artefact map is a pictorial rendition of only the detected mal-sampling artefact(s). To achieve this, the deep learning network is preferably trained with a set of modelled artefact maps at its output (the last network layer) and superpositions of training MR images with the respective modelled artefact maps at its input (the first network layer). For example, the modelled artefact maps can include point spread functions of single- or multi-voxel off-resonances computed at different off-resonance frequencies. In other words, the approach of the invention is to mimic the mal-sampling artefacts in their simplest form as the point spread function (corresponding to the used non-Cartesian k-space sampling scheme) in the presence of strong local off-resonance and to use these for training the deep learning network. For a more realistic appearance, the mal-sampling artefacts may be modelled as small convolved local aggregates of different point spread functions, each at slightly different off-resonance frequencies but close in space. For even further refinement of the artefact model, small geometric distortions can be added to the point spread function to account also for more complicated local aggregates of off-resonance voxels. The deep learning network is then trained with the modelled artefact maps as images showing only the expected mal-sampling artefacts (at the output of the network) along with the corresponding superpositions of the respective mal-sampling artefacts and an (artefact-free) training MR image (at the input of the network). This approach adopts the concept of "residual learning". It can be applied to complex as a well as magnitude MR image data.

Once the artefact map is available as the output of the deep learning network, the detected mal-sampling artefacts can easily be corrected, for example by subtracting the artefact map from the reconstructed (and optionally de-blurred) MR image.

In a further preferred embodiment, the correction is restricted to pre-defined image regions and/or to image-regions in which the $B_0$ map indicates that the inhomogeneity or the degree of local variation (gradient) of the main magnetic field exceeds a given threshold. To optimize the image quality, the information in the $B_0$ map can be used to appropriately restrict or constrain the artefact subtraction process to image regions which are clearly potential sources of artefacts. In this way, it is automatically avoided that anatomical structures which show structural similarities to the mal-sampling artefacts are removed, potentially spoiling important diagnostic information in the MR image. In a possible embodiment, the $B_0$ map information is directly used in the process of training the deep learning network in order to guide the artefact detection. Instead of only using the MR image with residual mal-sampling artefacts as input of the network, the $B_0$ map is also fed to the network at its input. In this way, the deep learning network automatically takes the $B_0$ map information into account, thereby avoiding incorrect identification of useful image structures as artefacts.

In a further embodiment, an anatomical atlas can be fitted to the imaging data (preferably volumetric, e.g. 3D or multi-slice data) allowing the identification of pre-defined image regions critical to the appearance of mal-sampling artefacts (e.g. in the head: the region near the optic-frontal cortex, or the inner ear cavities etc.). This can be used to restrict the detecting of one or more mal-sampling artefacts, e.g. in cases in which a $B_0$ map is not available. In such an event the correction for the indentified artefacts is also restricted to these pre-defined regions.

In yet another preferred embodiment, the deep learning network is a convolutional network. A so-called F-Net network architecture (see Brosch T, Saalbach A., "Foveal Fully Convolutional Nets for Multi-Organ Segmentation", Proceedings of the SPIE, volume 10574, 2018) can be used that relies on multiple resolution levels to extract high- and low-level features. Alternatively, other network architectures may be employed. For example, the so-called U-Net architecture (see Ronneberger, O., Fischer, P., Brox, T., "U-net: Convolutional networks for biomedical image segmentation", International Conference on Medical image computing and computer-assisted intervention, pp. 234-241, 20153) may also be used. If the $B_0$ map and the input MR image have very different resolutions, a tailored Y-Net architecture (see Mohammed, A., et al., "Y-Net: A deep Convolutional Neural Network for Polyp Detection". arXiv preprint arXiv:1806.01907, 2018) may be appropriate. In this architecture, the encoding path of the $B_0$ map, which will often have smaller resolution, can be realized using fewer layers and/or channels, thereby reducing the overall size of the network.

The method of the invention described thus far can be carried out by means of a MR device including at least one main magnet coil for generating a uniform static magnetic field within an examination volume, a number of gradient coils for generating switched magnetic field gradients in different spatial directions within the examination volume, at least one RF coil for generating RF pulses within the examination volume and/or for receiving MR signals from an object positioned in the examination volume, a control unit for controlling the temporal succession of RF pulses and switched magnetic field gradients, and a reconstruction unit for reconstructing a MR image from the received MR signals. The method of the invention can be implemented, for example, by a corresponding programming of the reconstruction unit and/or the control unit of the MR device.

The method of the invention can be advantageously carried out in most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device.

Moreover, the mal-sampling artefact detection and correction approach of the invention can be implemented as a retrospective artefact removal software tool to be installed on a diagnostic workstation.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF THE EMBODIMENTS

Figure 1:
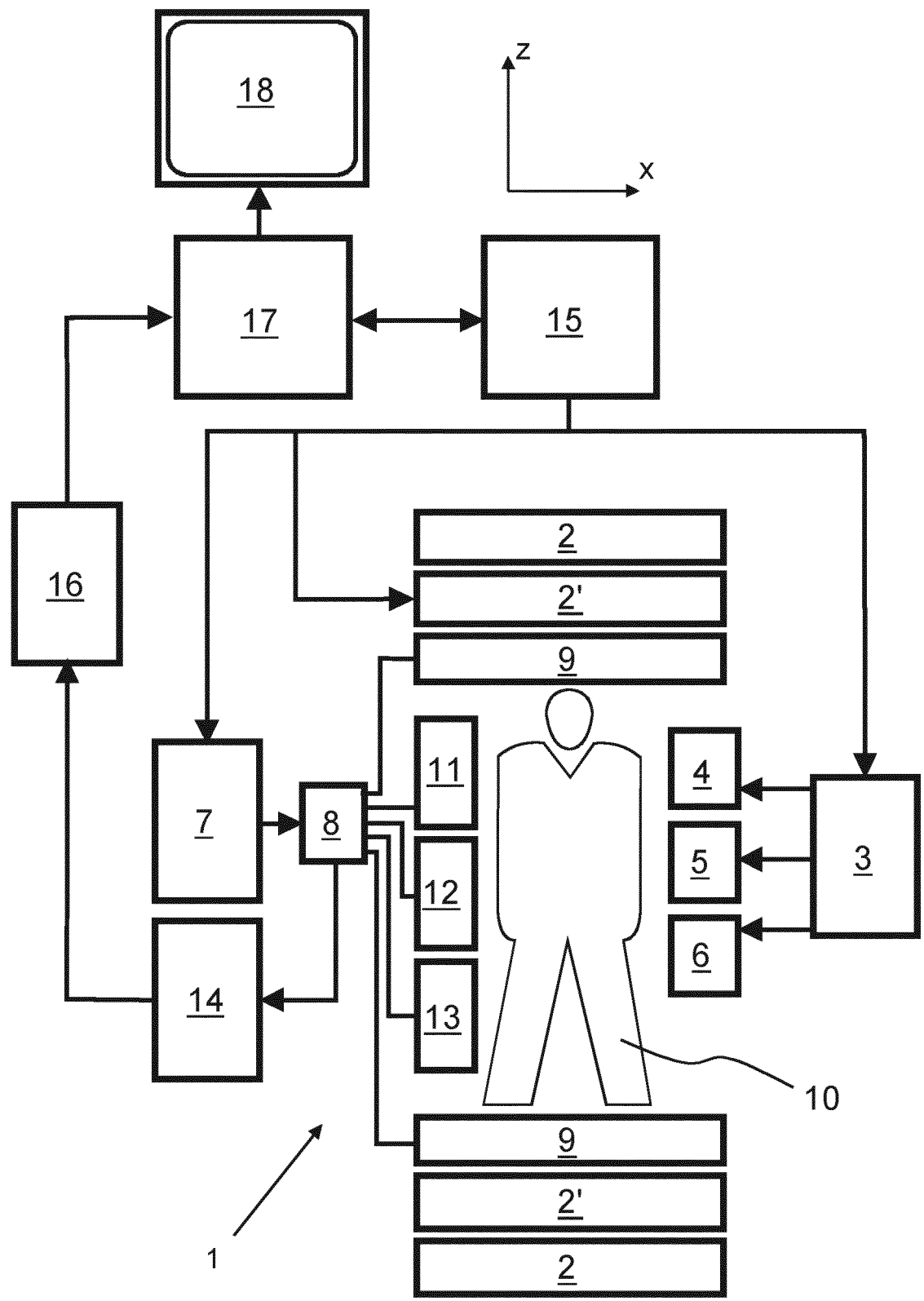
FIG. 1 shows a MR device for carrying out the method of the invention.

With reference to FIG. 1, a MR device 1 is schematically shown. The device comprises superconducting or resistive main magnet coils 2 such that a substantially uniform, temporally constant main magnetic field is created along a z-axis through an examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

More specifically, a gradient pulse amplifier 3 applies current pulses to selected ones of whole-body gradient coils 4, 5 and 6 along x, y and z-axes of the examination volume. A digital RF frequency transmitter 7 transmits RF pulses or pulse packets, via a send-/receive switch 8, to a whole-body volume RF coil 9 to transmit RF pulses into the examination volume. A typical MR imaging sequence is composed of a packet of RF pulse segments of short duration which taken together with each other and any applied magnetic field gradients achieve a selected manipulation of nuclear magnetic resonance. The RF pulses are used to saturate, excite resonance, invert magnetization, refocus resonance, or manipulate resonance and select a portion of a body 10 positioned in the examination volume. The MR signals are also picked up by the whole-body volume RF coil 9.

For generation of MR images of limited regions of the body 10, a set of local array RF coils 11, 12, 13 are placed contiguous to the region selected for imaging. The array coils 11, 12, 13 can be used to receive MR signals induced by body-coil RF transmissions.

The resultant MR signals are picked up by the whole body volume RF coil 9 and/or by the array RF coils 11, 12, 13 and demodulated by a receiver 14 preferably including a preamplifier (not shown). The receiver 14 is connected to the RF coils 9, 11, 12 and 13 via send-/receive switch 8.

A host computer 15 controls the gradient pulse amplifier 3 and the transmitter 7 to generate any of a plurality of MR imaging sequences, such as echo planar imaging (EPI), echo volume imaging, gradient and spin echo imaging, fast spin echo (TSE) imaging, and the like to acquire the MR signals along spiral k-space trajectories according to the invention. For the selected sequence, the receiver 14 receives a single or a plurality of MR data along the respective k-space trajectories in rapid succession following each RF excitation pulse. A data acquisition system 16 performs analog-to-digital conversion of the received signals and converts each MR signal to a digital format suitable for further processing. In modern MR devices the data acquisition system 16 is a separate computer which is specialized in acquisition of raw image data.

Ultimately, the digital raw image data is reconstructed into an image representation by a reconstruction processor 17 which applies a Fourier transform or other appropriate reconstruction algorithms. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 18 which provides a man-readable display of the resultant MR image.

The MR device 1 is arranged, e.g. by appropriate programming of the host computer 15 and the reconstruction processor 17, to perform the imaging method of the invention as described herein above and in the following.

Figure 2:
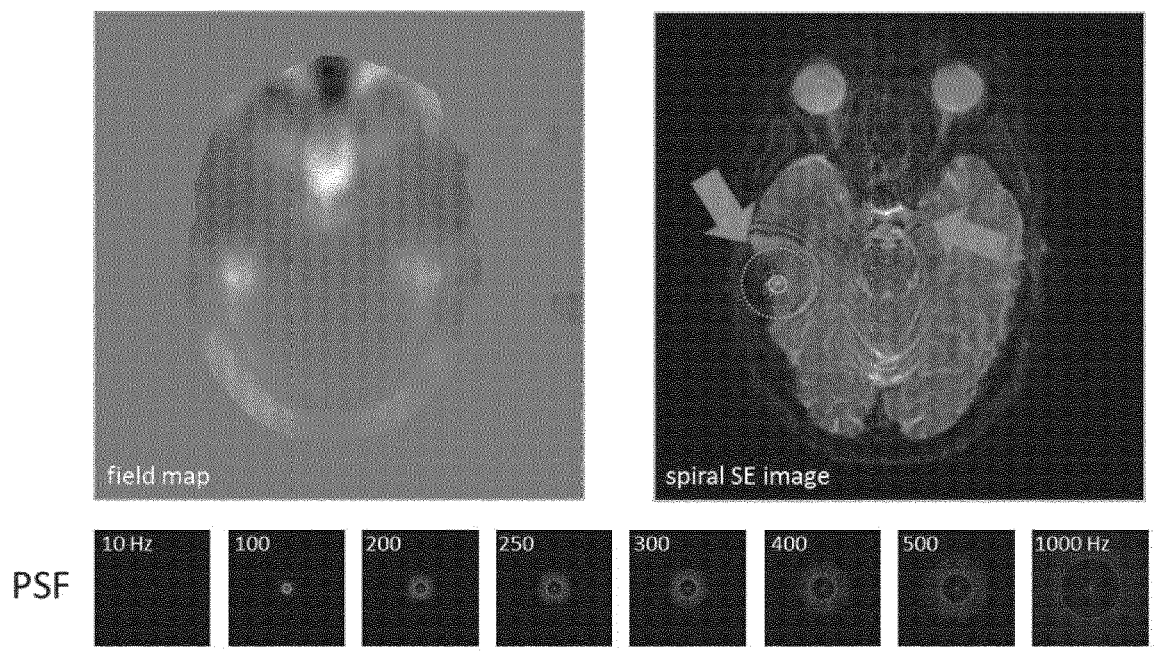
FIG. 2 shows a $B_0$ map and a reconstructed and de-blurred MR head image together with a set of point spread functions modelled for different local off-resonances.
Figure 3:
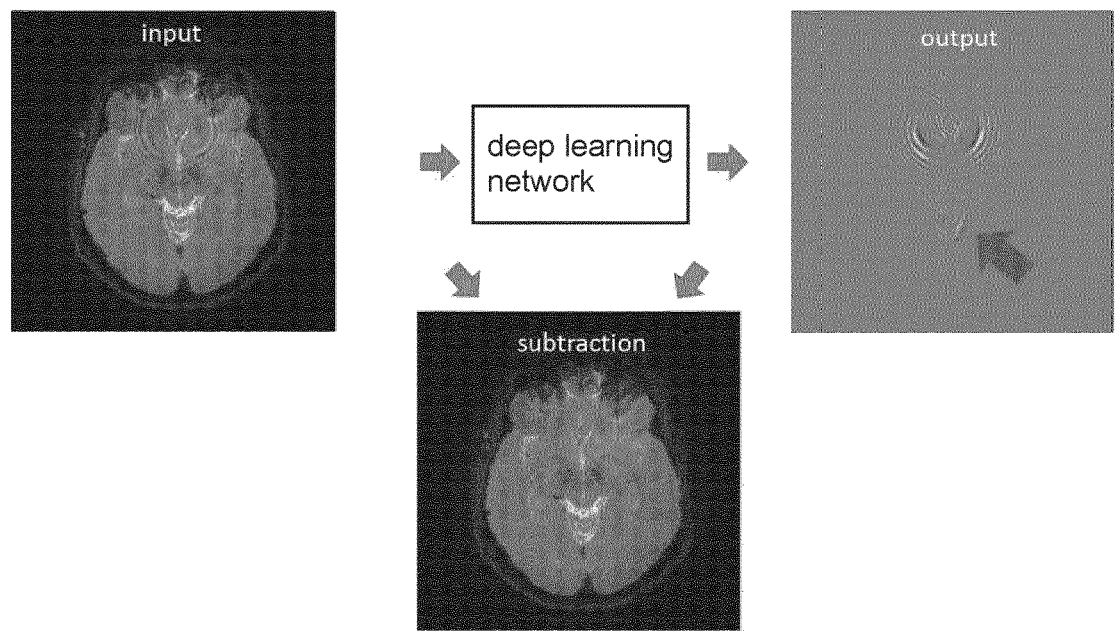
FIG. 3 illustrates the approach of the invention for mal-sampling artefact-correction in a spiral MR head image.
Figure 4:
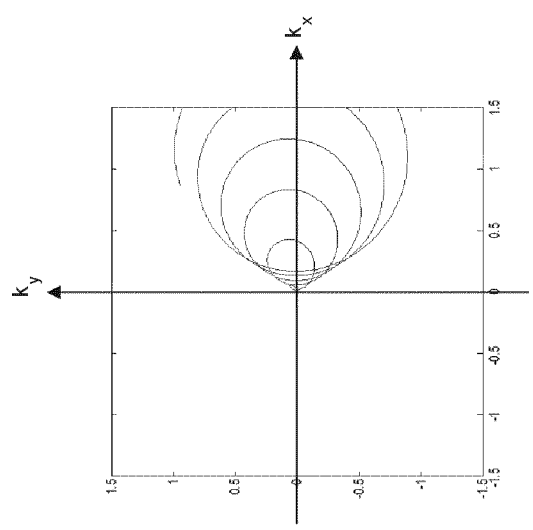
FIG. 4 shows k-space diagrams illustrating the source of mal-sampling artefacts in a spiral MR imaging example.
Figure 4:
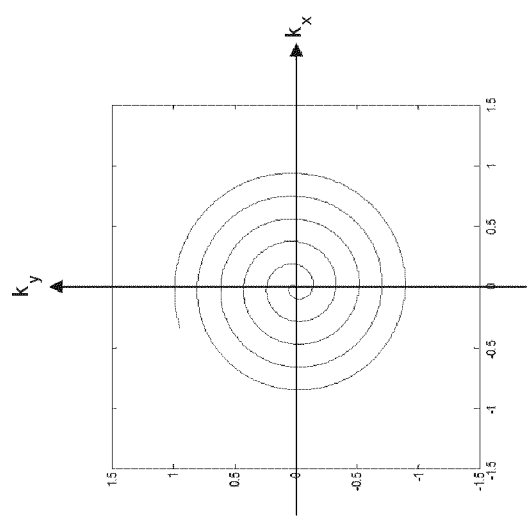

With continuing reference to FIG. 1 and with further reference to FIGS. 2 and 3, an embodiment of the imaging approach of the invention is explained.

In the exemplary embodiment, spin-echo $T_2$-weighted spiral imaging is performed. Only a single spiral trajectory is acquired during an acquisition window of 50 ms at an echo time of 60 ms. Parallel imaging is used with a reduction factor of R=3. Using iterative spiral SENSE image reconstruction and appropriate $B_0$ map-based de-blurring the spiral spin echo (SE) MR image (see top right image in FIG. 2) is obtained. Also the (separately acquired) $B_0$ field map used for de-blurring is shown in FIG. 2 (top left image). Due to the long acquisition window chosen to optimize scan efficiency and the high and strongly varying local field inhomogeneities that can be seen in the $B_0$ map, uncorrected mal-sampling artefacts remain in the reconstructed MR image after $B_0$ map-based off-resonance correction (deblurring). The mal-sampling artefacts remaining manifest themselves as ringing-type structures indicated by arrows. In the bottom row of FIG. 2, computed point spread functions (single-voxel signal representations) are shown for different off-resonance frequencies given in Hz and for the given spiral k-space trajectory used in the MR signal acquisition. For the location near to the inner ear in the top right MR image, the $B_0$ map predicts a deviation of 250 Hz. The corresponding inner ring dimension of the point spread function is superimposed in the images. This point spread function mimics the signal contribution stemming from the voxel or an voxel aggregate in the centre of the marked location (small circle) which is distorted to unrecognizability according to the strong local gradients present and which could not be corrected anymore on the basis of the $B_0$ map. The mal-sampling artefact may not result only from one voxel. It could result from a small aggregate of a few voxels, close to each other, having different intensities, experiencing different degrees of actual local inhomogeneity resulting in a more complex distorted non-rotational or skewed artefact pattern. As described above, the computed point spread functions are used as model artefact maps to train a deep learning network. In the shown embodiment, an F-Net architecture is used that relies on multiple resolution levels to extract both high- and low-level features. Three different resolution levels, each with two convolutional layers, are employed.

As illustrated in FIG. 3, the trained deep learning network analyzes the spiral MR image comprising mal-sampling artefacts (top left image). The network derives an artefact map from the MR image, which artefact map is an estimate of the mal-sampling artefacts in the MR image. The detected artefacts are corrected for based on the artefact map by subtracting the artefact map from the MR image. The corrected MR image is the bottom image in FIG. 3. The arrow in the artefact map indicates an incorrectly detected mal-sampling artefact based on a misinterpretation of the deep learning network. Using the $B_0$ map, regions with strong inhomogeneities and steep gradients can be identified. Residual mal-sampling artefacts can be expected to occur only in these regions of the MR image. A correction of the MR image based on the derived artefact map is consequently allowed only in these regions. The information from the $B_0$ map can be used to derive a corresponding subtraction mask which is "one" at the locations of strong inhomogeneities and steep gradients and smoothly drops to "zero" in the non-suspicious regions, i.e. where the local inhomogeneity variations are below a critical threshold such that artefacts due to off-resonance gradients induced insufficient sampling cannot be expected.

In a further embodiment, an anatomical atlas can be fitted to the imaging data (preferably volumetric e.g. 3D or multi-slice data) allowing for the identification of regions of strong local susceptibility gradients, critical to such artefact appearance (in the head, regions near the optic-frontal cortex, or the inner ear cavities etc.) supporting this weighed artefact subtraction in case field map information is not available.

In this way, it is automatically avoided that anatomical structures which show similarities to artefacts are wrongly removed and affect the clinical value of the image.

The invention claimed is:

1. A method of magnetic resonance (MR) imaging of an object positioned in an examination volume of an MR device, the method comprising:
    subjecting the object to an imaging sequence comprising at least one RF excitation pulse and modulated magnetic field gradients,
    acquiring MR signals along at least one non-Cartesian k-space trajectory,
    reconstructing an MR image from the acquired MR signals,
    deblurring the reconstructed MR image based on a $B_0$ map; and
    detecting one or more mal-sampling artefacts caused by inhomogeneity induced insufficient k-space sampling in the deblurred MR image using a deep learning network.

2. The method of claim 1, wherein the non-Cartesian k-space trajectory is a spiral k-space trajectory.

3. The method of claim 1, wherein the deep learning network is trained to derive an artefact map from the deblurred MR image, wherein the artefact map is a pictorial rendition of only the one or more detected mal-sampling artefacts.

4. The method of claim 3, wherein the deep learning network is trained with a set of modelled artefact maps at an output of the deep learning network, and superpositions of training MR images with the respective modelled artefact maps at an input of the deep learning network.

5. The method of claim 4, wherein the modelled artefact maps include point spread functions of single- or multi-voxel off-resonances computed for the imaging sequence.

6. The method of claim 3, wherein the detected one or more mal-sampling artefacts are corrected for by subtracting the artefact map from the reconstructed and deblurred MR image.

7. The method of claim 1, wherein the detecting one or more mal-sampling artefacts is restricted to pre-defined image regions and/or to image regions in which the $B_0$ map indicates that the inhomogeneity or the degree of local variation of a main magnetic field exceeds a given threshold.

8. The method of claim 1, wherein the $B_0$ map is used as a further input of the deep learning network during the detection of the one or more mal-sampling artefacts.

9. The method of claim 1, wherein the deep learning network is a convolutional network.

10. A magnetic resonance (MR) device including at least one main magnet coil for generating a uniform, static magnetic field within an examination volume, a number of gradient coils for generating switched magnetic field gradients in different spatial directions within the examination volume, at least one RF coil for generating RF pulses within the examination volume and/or for receiving MR signals from an object positioned in the examination volume, a control unit for controlling a temporal succession of RF pulses and switched magnetic field gradients, and a reconstruction unit for reconstructing a MR image from the received MR signals, wherein the MR device is arranged to perform a method comprising:
    subjecting the object to an imaging sequence comprising at least one RF excitation pulse and modulated magnetic field gradients,
    acquiring MR signals along at least one non-Cartesian k-space trajectory, reconstructing an MR image from the acquired MR signals, deblurring the reconstructed MR image based on a $B_0$ map; and detecting one or more mal-sampling artefacts caused by inhomogeneity induced insufficient k-space sampling in the deblurred MR image using a deep learning network.

11. The MR device of claim 10, wherein the deep learning network is trained to derive an artefact map from the deblurred MR image, wherein the artefact map is a pictorial rendition of the one or more detected mal-sampling artefacts, and the method further comprises:

correcting the deblurred MR image for the detected one or more mal-sampling artefacts by subtracting the artefact map from the deblurred MR image.

12. A computer program comprising instructions stored on a non-transitory computer readable medium such that when executed:

reconstructs a magnetic resonance (MR) image from MR signals acquired using non-Cartesian k-space sampling, deblurs the reconstructed MR image based on a $B_0$ map; and detecting one or more mal-sampling artefacts caused by inhomogeneity induced insufficient k-space sampling in the deblurred MR image using a deep learning network.

13. The computer program of claim 12, wherein the deep learning network is trained to derive an artefact map from the deblurred MR image, wherein the artefact map is a pictorial rendition of the one or more detected mal-sampling artefacts, and the method further comprises:

correcting the deblurred MR image for the detected one or more mal-sampling artefacts by subtracting the artefact map from the deblurred MR image.

* * * * *